(12) United States Patent
Yajima et al.

(10) Patent No.: US 9,536,849 B2
(45) Date of Patent: Jan. 3, 2017

(54) SEMICONDUCTOR DEVICE AND MANUFACTURING METHOD OF THE SAME

(71) Applicant: Renesas Electronics Corporation, Tokyo (JP)

(72) Inventors: Akira Yajima, Ibaraki (JP); Hideki Harano, Gunma (JP); Katsuhiro Torii, Ibaraki (JP); Hironori Ochi, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/097,111

(22) Filed: Apr. 12, 2016

(65) Prior Publication Data

US 2016/0322321 A1 Nov. 3, 2016

(30) Foreign Application Priority Data

Apr. 30, 2015 (JP) ................. 2015-092604

(51) Int. Cl.
*H01L 21/44* (2006.01)
*H01L 23/48* (2006.01)
(Continued)

(52) U.S. Cl.
CPC ............. *H01L 24/13* (2013.01); *H01L 21/563* (2013.01); *H01L 23/3185* (2013.01);
(Continued)

(58) Field of Classification Search
CPC ............. H01L 2224/13014; H01L 2224/0133; H01L 2224/3185; H01L 2224/13147; H01L 2224/11462; H01L 2224/13083; H01L 2224/13026; H01L 2224/11019; H01L 2224/13551; H01L 2224/13155; H01L 2224/13017; H01L 24/13; H01L 24/11; H01L 21/563; H01L 2224/3225; H01L 2224/73267; H01L 2224/8203; H01L 2224/04105; H01L 2224/24226; H01L 2224/92244
See application file for complete search history.

(56) References Cited

U.S. PATENT DOCUMENTS

2008/0006936 A1\* 1/2008 Hsu .................. H01L 23/5389
257/731
2013/0249075 A1\* 9/2013 Tateiwa ............... H05K 3/4682
257/734

FOREIGN PATENT DOCUMENTS

JP 3089943 B2 9/2000
JP 2001-053200 A 2/2001
(Continued)

*Primary Examiner* — Hoa B Trinh

(74) *Attorney, Agent, or Firm* — McGinn IP Law Group, PLLC

(57) ABSTRACT

A semiconductor device includes a semiconductor substrate, a pad electrode formed on the semiconductor substrate, a post electrode formed on the pad electrode and made of a copper film, a solder ball electrode formed on the post electrode and made of ternary alloy containing tin, a terminal connected to the solder ball electrode and formed on a front surface of a wiring board, and a sealing material filling a gap between the semiconductor substrate and the wiring board. The post electrode includes a cylindrical stem portion and an overhanging portion positioned in an upper part of the stem portion and protruding to an outer side of the stem portion, the solder ball electrode is connected to an upper surface of the post electrode over the stem portion and the overhanging portion, and a sidewall of the stem portion contacts with the sealing material over the entire circumference thereof.

15 Claims, 14 Drawing Sheets

(51) Int. Cl.
*H01L 23/00* (2006.01)
*H01L 23/31* (2006.01)
*H01L 21/56* (2006.01)

(52) U.S. Cl.
CPC ..... *H01L 24/11* (2013.01); *H01L 2224/11019* (2013.01); *H01L 2224/11462* (2013.01); *H01L 2224/11849* (2013.01); *H01L 2224/13014* (2013.01); *H01L 2224/13017* (2013.01); *H01L 2224/13026* (2013.01); *H01L 2224/13083* (2013.01); *H01L 2224/13144* (2013.01); *H01L 2224/13147* (2013.01); *H01L 2224/13155* (2013.01); *H01L 2224/13551* (2013.01); *H01L 2224/13564* (2013.01); *H01L 2924/014* (2013.01); *H01L 2924/0133* (2013.01); *H01L 2924/3512* (2013.01)

(56) References Cited

FOREIGN PATENT DOCUMENTS

| | | |
|---|---|---|
| JP | 2006-059917 A | 3/2006 |
| JP | 2013-115336 A | 6/2013 |

\* cited by examiner

SEMICONDUCTOR DEVICE AND MANUFACTURING METHOD OF THE SAME

CROSS-REFERENCE TO RELATED APPLICATION

The present application claims priority from Japanese Patent Application No. 2015-092604 filed on Apr. 30, 2015, the content of which is hereby incorporated by reference into this application.

TECHNICAL FIELD OF THE INVENTION

The present invention relates to a semiconductor device and a manufacturing method of the same, and relates to, for example, a technique effectively applied to a semiconductor device including a semiconductor chip on which a bump electrode is formed and a manufacturing method of the same.

BACKGROUND OF THE INVENTION

Japanese Patent Application Laid-Open Publication No. 2013-115336 (Patent Document 1) discloses that bonding strength of a bump is improved by providing a protruding portion 1j, which protrudes in a horizontal direction, in a columnar electrode 1i to which the bump is bonded.

Japanese Patent Application Laid-Open Publication No. 2006-59917 (Patent Document 2) discloses a technique of providing a core bump 5 having locking means formed on an element electrode 3 and an external circuit connection bump 2 with which the core bump 5 is coated, thereby securing a bump height after the secondary mounting and achieving the stress relaxation.

Japanese Patent Application Laid-Open Publication No. 2001-53200 (Patent Document 3) discloses a technique of providing a first sealing resin film 8 which coats and surrounds a solder bump 7 formed above an electrode pad 3 with a metal multilayer film 6 interposed therebetween and a second sealing resin film 9 which coats a rear surface side of a semiconductor substrate 2, thereby achieving the thickness reduction while maintaining the strength.

FIG. 1 of Japanese Patent No. 3089943 (Patent Document 4) discloses a solder bump electrode 18 in which a Cu electrode 16 having a mushroom shape is formed on a metal wiring 12 with a barrier layer 14 or the like interposed therebetween and a solder layer 17 is further formed thereon.

SUMMARY OF THE INVENTION

A bump electrode of a semiconductor chip which has been studied by the inventors of the present application is formed as follows.

That is, after a seed film is formed on a pad electrode formed of a wiring layer on a semiconductor substrate and a resist film to open a region in which a bump electrode is formed is formed on the seed film, a post electrode having a cylindrical shape made of a Cu plating film is formed by a plating method, the resist film is removed, and then the seed film extending between the post electrodes or to an outside of the post electrode is removed by etching. Next, after a solder ball having spherical shape is supplied onto the post electrode, the solder ball is melted by performing reflow for formation of the bump electrode to form a solder ball electrode on an upper surface of the post electrode, thereby completing the bump electrode of the semiconductor chip.

Further, after a pre-solder (preliminary solder) is provided on a terminal of a wiring board, the semiconductor chip is mounted to the wiring board. When reflow for mounting (heat treatment) is performed in a state in which the bump electrode is disposed on the terminal of the wiring board via the pre-solder, the bump electrode is bonded to the terminal, and a semiconductor device which includes the semiconductor chip having the bump electrode is completed.

The semiconductor device which has been studied by the inventors of the present application has a structure in which a height (H1) of the post electrode constituting the bump electrode is larger than a height (H2) of the solder ball electrode after the reflow (H1>H2). Thus, the resist film used in the plating process in forming the post electrode needs to have a film thickness of, for example, 40 μm or larger and a thick resist film or film resist has been used. According to the study by the inventors of the present application, the material cost of the thick resist film or film resist is high. In addition, it has been found out that there is a problem that the processing time and processing cost for an exposure process and a development process increase. Thus, the inventors of the present application have studied a technique of reducing the height of the post electrode.

Here, the semiconductor chip made of silicon or the like is mounted on the wiring board made of a glass epoxy resin, but there is a risk that the connection between the bump electrode and the terminal is broken when stress is applied to the bump electrode which connects the semiconductor chip and the wiring board due to installation environment of the semiconductor device or heat generated during the operation of the semiconductor chip. Such stress is generated based on a difference in linear expansion coefficient between the semiconductor chip and the wiring board, and the bump electrode needs to have a desired height in order to relax the stress. In other words, it is necessary to obtain the height by the post electrode and the solder ball electrode.

The inventors of the present application have studied how to obtain the height of the bump electrode by the solder ball electrode based on the above-described study, and have confirmed the following problem.

It is necessary to form the bump electrode using the solder ball with a large diameter in order to obtain the height of the bump electrode. However, it has been found out that, when the reflow for formation of the bump electrode is performed after disposing the solder ball with the large diameter on the post electrode having the cylindrical shape, the solder (particularly, tin (Sn)) constituting the solder ball flows out to a sidewall of the post electrode and reaches the pad electrode of the semiconductor chip. In addition, it has also been found out that, since tin (Sn) has a higher hardness than copper (Cu) and the solder flowing out to the sidewall of the post electrode is present unevenly on the sidewall, a phenomenon that the stress is locally concentrated to the pad electrode occurs, and a crack is generated in a surface protection film, an interlayer insulating film or the like of the semiconductor chip described later, so that there occurs a problem that the moisture resistance is reduced or the wiring is disconnected. Such a phenomenon is referred to as a "solder adhesion failure."

In other words, the improvement in reliability or the improvement in performance is required in the semiconductor device having the bump electrode.

The other problems and novel characteristics will be apparent from the description of the present specification and the accompanying drawings.

A semiconductor device according to an embodiment includes a semiconductor substrate, a pad electrode formed on the semiconductor substrate, a post electrode formed on the pad electrode and made of a copper film, a solder ball electrode formed on the post electrode and made of ternary alloy containing tin, a terminal connected to the solder ball electrode and formed on a front surface of a wiring board, and a sealing material filling a gap between the semiconductor substrate and the wiring board. The post electrode includes a cylindrical stem portion and an overhanging portion positioned in an upper part of the stem portion and protruding to an outer side of the stem portion, the solder ball electrode is connected to an upper surface of the post electrode over the stem portion and the overhanging portion, and a sidewall of the stem portion of the post electrode is in contact with the sealing material over the entire circumference thereof.

According to an embodiment, it is possible to improve the reliability or performance of a semiconductor device.

BRIEF DESCRIPTIONS OF THE DRAWINGS

DESCRIPTIONS OF THE PREFERRED EMBODIMENTS

Figure 1:
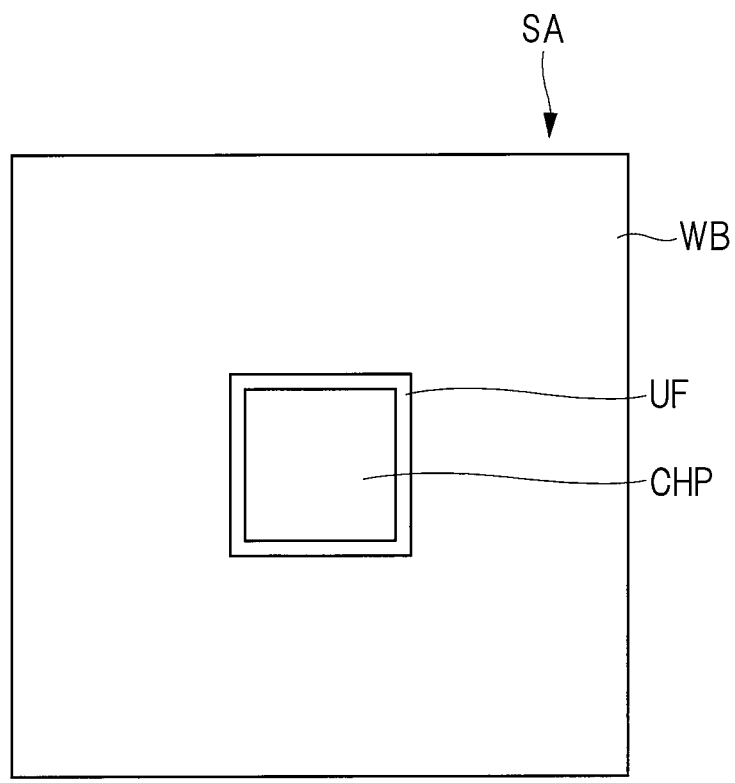
FIG. 1 is a top view of a semiconductor device according to an embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, the components (including element steps) are not always indispensable unless otherwise stated or except the case where the components are apparently indispensable in principle.

Similarly, in the embodiments described below, when the shape of the components, positional relation thereof and the like are mentioned, the substantially approximate and similar shapes and the like are included therein unless otherwise stated or except the case where it is conceivable that they are apparently excluded in principle. The same goes for the numerical values and ranges described above.

Also, the same components are denoted by the same reference characters throughout the drawings for describing the embodiments, and the repetitive description thereof will be omitted. In some drawings, hatching is used even in a plan view so as to make the drawings easy to see.

Embodiment

<Structure of Semiconductor Device>

FIG. 1 is a top view of a semiconductor device SA according to the present embodiment. As illustrated in FIG. 1, the semiconductor device SA according to the present embodiment includes a wiring board WB having a rectangular shape, and a semiconductor chip CHP having a rectangular shape is mounted on a center portion of the wiring board WB via a sealing material (underfill) UF. As illustrated in FIG. 1, a size of the semiconductor chip CHP is smaller than a size of the wiring board WB. For example, a length of one side of the wiring board WB is about 8 mm to 15 mm and a thickness thereof is about 0.2 mm to 0.6 mm. On the other hand, a length of one side of the semiconductor chip CHP is about 3 mm to 12 mm and a thickness thereof is about 0.05 mm to 0.7 mm.

Figure 2:
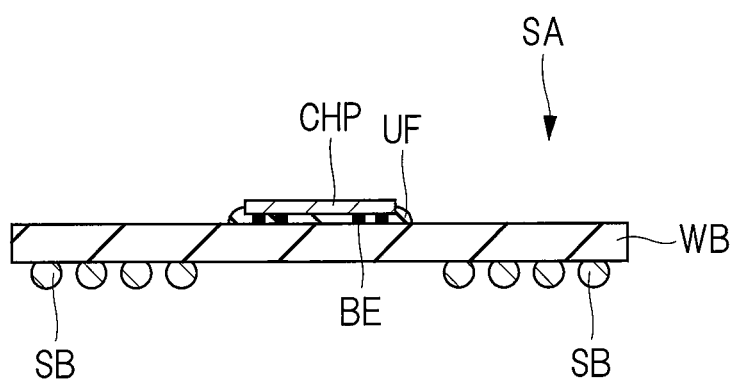
FIG. 2 is a side view of the semiconductor device according to the embodiment.

Next, FIG. 2 is a side view of the semiconductor device SA according to the present embodiment. As illustrated in FIG. 2, the semiconductor device SA according to the present embodiment includes the wiring board WB, and a plurality of board solder balls SB are formed on a rear surface (bottom surface) of the wiring board WB.

Meanwhile, the semiconductor chip CHP is mounted on a front surface (upper surface) of the wiring board WB, and a plurality of bump electrodes BE are formed on the semiconductor chip CHP. A height of the bump electrode BE is, for example, about 40 μm to 200 μm. Further, the semiconductor chip CHP and the wiring board WB are electrically connected to each other via these bump electrodes BE. As illustrated in FIG. 2, a gap between the semiconductor chip CHP and the wiring board WB which is formed due to the presence of the bump electrodes BE is filled with the sealing material UF.

Figure 3:
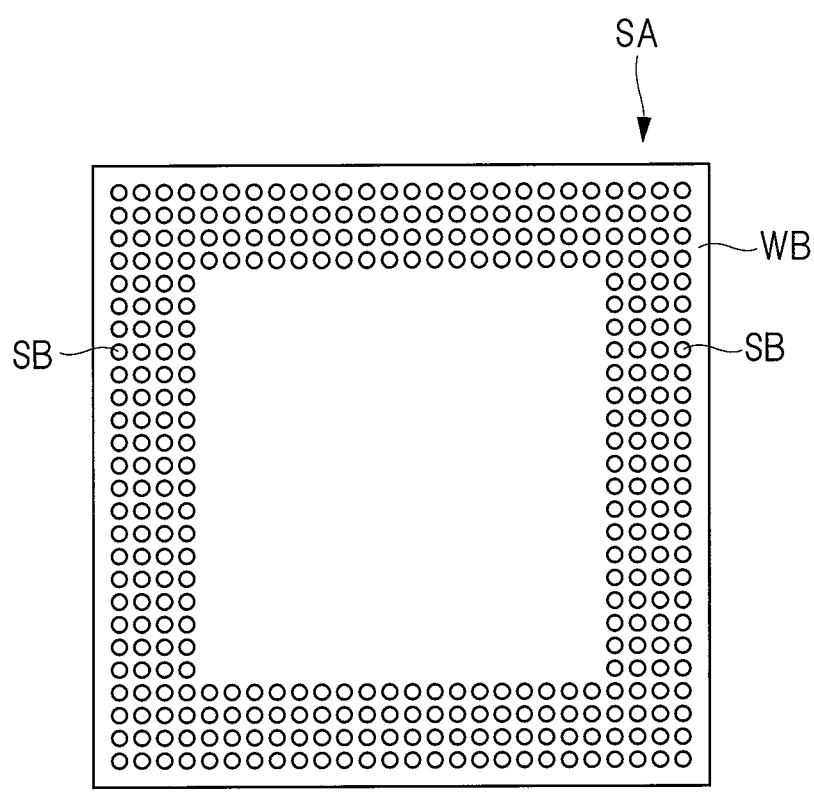
FIG. 3 is a bottom view of the semiconductor device according to the embodiment.

Next, FIG. 3 is a bottom view of the semiconductor device SA according to the present embodiment. As illustrated in FIG. 3, the plurality of board solder balls SB are arranged in an array form on the rear surface of the wiring board WB. FIG. 3 illustrates a case in which the board solder balls SB are arranged in four lines along an outer peripheral portion (outer edge portion) of the wiring board WB by way of example. These board solder balls SB function as external connection terminals for connecting the semiconductor device SA with the external device. Namely, the board solder ball SB is used to mount the semiconductor device SA to, for example, a circuit board typified by a motherboard.

Figure 4:
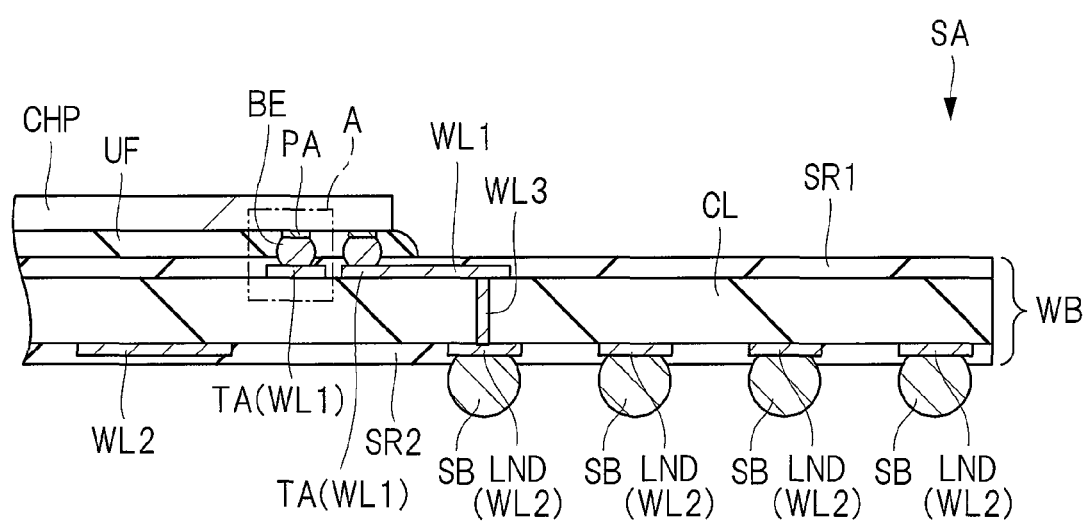
FIG. 4 is a partial cross-sectional view of the semiconductor device according to the embodiment.

FIG. 4 is a partial cross-sectional view of the semiconductor device SA according to the present embodiment. Although the wiring board WB has a multilayer wiring structure, FIG. 4 illustrates only each single layer of a core layer CL, a wiring WL1 on a front surface side of the core layer CL and a wiring WL2 on a rear surface side of the core layer CL. An upper surface and a side surface of the wiring WL1 formed on the front surface side of the core layer CL are coated with a solder resist film SR1. A terminal TA formed in a part of the wiring WL1 is exposed from the solder resist film SR1 in an opening portion provided in the solder resist film SR1, and the bump electrode BE is connected to the terminal TA in the opening portion. An upper surface and a side surface of the wiring WL2 formed on the rear surface side of the core layer CL are coated with a solder resist film SR2. A land LND formed in a part of the wiring WL2 is exposed from the solder resist film SR2 in an opening portion provided in the solder resist film SR2, and the board solder ball SB is connected to the land LND in the opening portion. The wiring WL1 on the front surface is connected to the wiring WL2 on the rear surface through a wiring WL3 provided in a via penetrating the core layer CL. The solder resist films SR1 and SR2 are insulating films made of an insulating resin, and the core layer CL is made of a resin board having a glass epoxy resin or the like as an insulating layer.

The semiconductor chip CHP is mounted on the wiring board WB, and the bump electrode BE connected to a pad electrode PA formed on a main surface of the semiconductor chip CHP is connected to the terminal TA exposed from the solder resist film SR1. Further, the gap between the semiconductor chip CHP and the wiring board WB is filled with the sealing material UF. At this time, the semiconductor chip CHP is mounted on the front surface of the wiring board WB via the bump electrode BE so that the main surface of the semiconductor chip is opposed to the front surface of the wiring board WB. Further, a gap between the main surface of the semiconductor chip and the front surface of the wiring board WB is completely filled with the sealing material UF, and gaps between the plurality of bump electrodes BE are also completely filled with the sealing material UF. In other words, a sidewall (side surface) of the bump electrode BE is in contact with the sealing material UF over the entire circumference. The sealing material UF is provided in order to relax the stress applied to a bonding portion between the bump electrode BE and the terminal TA, for example, and is made of an insulating resin film such as an epoxy resin or the like.

Figure 5:
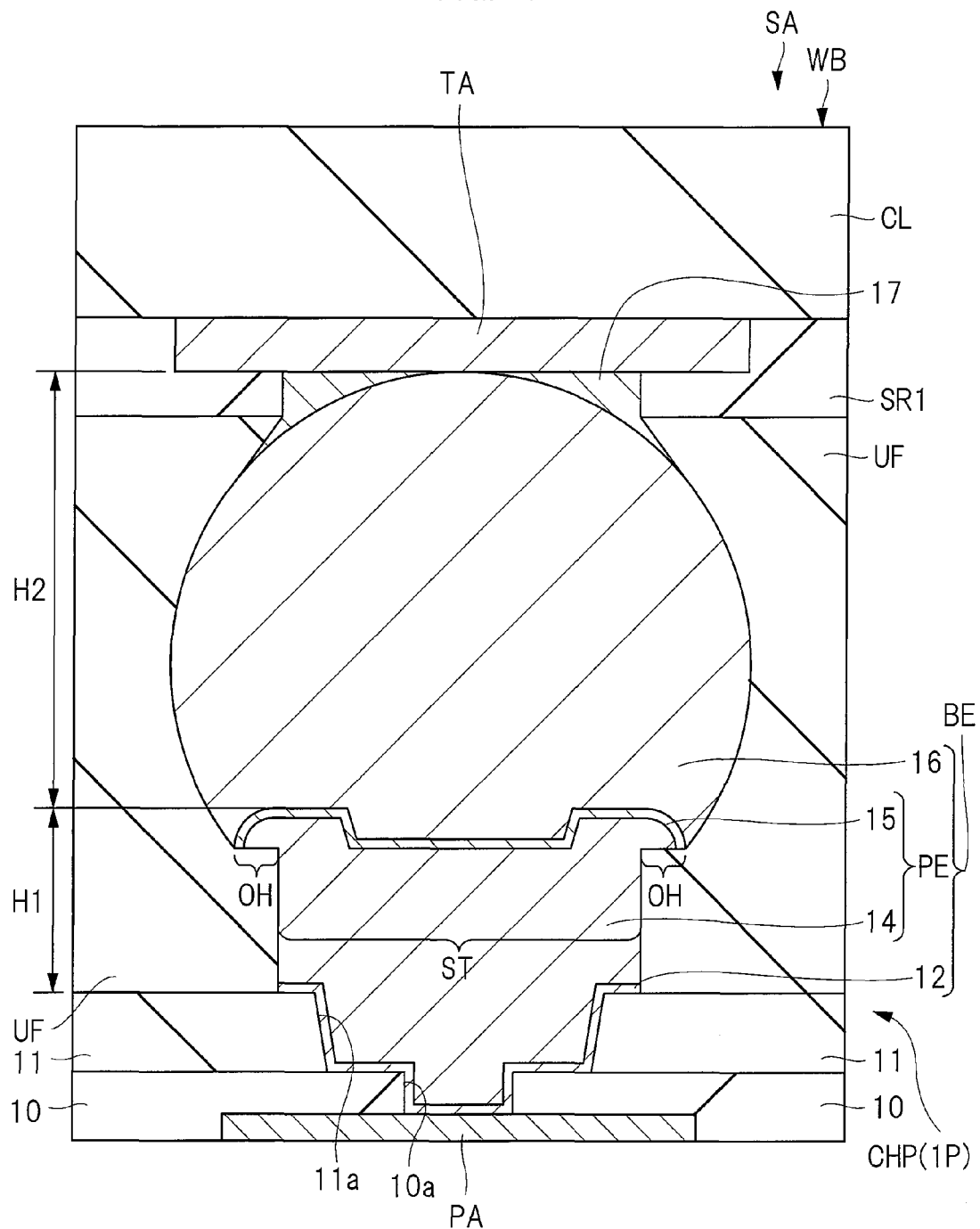
FIG. 5 is an enlarged view of a section A of FIG. 4.

FIG. 5 is an enlarged view of a section A of FIG. 4. However, a positional relationship is turned upside down from FIG. 4. In other words, the semiconductor chip CHP is illustrated on a lower side and the wiring board WB is illustrated on an upper side in FIG. 5. In addition, illustration of the layers below the pad electrode PA of the semiconductor chip CHP is omitted. With respect to the wiring board WB, only each part of the terminal TA, the solder resist film SR1 and the core layer CL is illustrated.

The pad electrode PA formed on the main surface of the semiconductor chip CHP is covered with a surface protection film 10 made of an inorganic insulating film, and the surface protection film 10 has an opening 10a which partially exposes a main surface of the pad electrode PA. The surface protection film 10 is constituted of, for example, a laminated film including a silicon oxide film and a silicon nitride film on the silicon oxide film, a film thickness of the laminated film is about 0.5 µm to 1.0 µm, and it is preferable that the silicon nitride film is thicker than the silicon oxide film from a point of view of improving the moisture resistance. The surface protection film 10 may be a single layer of a silicon oxide film or a silicon nitride film.

A protection film 11 made of an insulating film is formed on the surface protection film 10, and the protection film 11 has an opening 11a which encompasses the opening 10a. The opening 10a and the opening 11a have a rectangular or square shape, and the opening 10a is positioned at a center portion of the opening 11a when seen in a plan view. The protection film 11 is made of an organic insulating film, and it is possible to use, for example, a polyimide-based resin, a benzocyclobutene-based resin, an acrylic-based resin, an epoxy-based resin, a silicon-based resin or the like. The protection film 11 has a film thickness of 1.5 µm to 2.5 µm in order to relax the stress to be received by the bump electrode BE.

A seed film 12 made of a conductive film in contact with the upper surface of the pad electrode PA is formed on the surface protection film 10 and the protection film 11. The seed film 12 is continuously formed on the upper surface of the pad electrode PA, a sidewall and an upper surface of the surface protection film 10 and a sidewall and an upper surface of the protection film 11 in the opening 10a and the opening 11a. The seed film 12 is configured to have a laminated structure of a barrier film and a plating seed film. The barrier film which is a metal film has a function to prevent copper (Cu) constituting a post electrode PE to be described later from spreading to the pad electrode PA, and is configured to include any one of a titanium nitride film (TiN film), a titanium film (Ti film) and a titanium tungsten film (TiW film), for example. The plating seed film which is a metal film functions as a seed layer in an electrolytic plating process of copper (Cu) constituting the post electrode PE to be described later. The plating seed film is made of, for example, a copper (Cu) film. For example, a film thickness of the barrier film is about 50 nm to 200 nm, and a film thickness of the plating seed film is about 100 nm to 500 nm.

The post electrode PE made of a metal film is formed on the seed film 12. The post electrode PE is configured to have a laminated structure of a first plating film 14 and a second plating film 15. The post electrode PE includes a stem portion ST having a cylindrical shape and an overhanging portion OH which protrudes from an upper part of the stem portion ST to an outer side of the stem portion ST. The overhanging portion OH can be regarded as a branch portion overhanging from the stem portion ST. When seen in a plan view, the stem portion ST of the post electrode PE has a circular shape, and a contour of the overhanging portion OH also has a circular shape. The overhanging portion OH is formed over the entire circumference of the stem portion ST and protrudes from an outer periphery of the stem portion ST by a protruding width W1. In other words, when seen in a plan view, a diameter R2 of the contour of the overhanging portion OH is larger than a diameter R1 of the stem portion ST by twice the protruding width W1 (R2=R1+2W1).

The overhanging portion OH of the post electrode PE has a function to prevent the solder material (for example, tin (Sn)) constituting a solder ball electrode 16 from flowing to the sidewall of the post electrode PE. Accordingly, it is preferable to set the protruding width W1 to be 2 μm to 10 μm. The protruding width W1 of 2 μm or more is effective for preventing the flowing of the solder material mentioned above, but the protruding width W1 of 10 μm or less is preferable in consideration of the short-circuit with the neighboring bump electrode BE or the like.

The first plating film 14 is made of, for example, a copper (Cu) film, and is preferably a thick film in order to relax the stress applied to the bump electrode BE, but the film thickness is preferably in a range of 10 μm to 30 μm in consideration of the manufacturing cost or the like. As the second plating film 15, for example, a nickel (Ni) film or a nickel (Ni) alloy film may be used. The nickel (Ni) film or the nickel (Ni) alloy film has a spreading barrier function to prevent tin (Sn) contained in a solder ball electrode to be described later from spreading into a copper (Cu) film constituting the post electrode PE. In other words, for example, when the nickel (Ni) film or the nickel (Ni) alloy film is used as the second plating film 15, it is possible to improve the high temperature moisture resistance of the bump electrode BE. Although depending also on a required heat resistance, a film thickness of the nickel (Ni) film or the nickel (Ni) alloy film is preferably about 0.5 μm to 4.0 μm.

In addition, the second plating film 15 may be formed as a laminated film including a nickel (Ni) film or a nickel (Ni) alloy film and a gold (Au) film or a gold (Au) film and a palladium (Pd) film (structure in which a palladium film is laminated on a gold film) formed on a front surface thereof. With such a structure, it is possible to prevent the oxidation of a front surface of the nickel (Ni) film or the nickel (Ni) alloy film, and further, to improve the wettability of the solder material of the solder ball electrode 16 with respect to the nickel (Ni) film or the nickel (Ni) alloy film. Incidentally, a film thickness of the gold (Au) film can be set to about 0.03 to 0.2 μm, and a film thickness of the palladium (Pd) film can be set to about 0.1 to 0.2 μm.

In addition, the gold (Au) film or the laminated film of the gold (Au) film and the palladium (Pd) film may be directly provided on the copper (Cu) film constituting the post electrode PE. In such a case, the oxidation of the copper (Cu) film constituting the post electrode PE is prevented, and the wettability of the solder material of the solder ball electrode 16 with respect to the copper (Cu) film is improved.

Also, a concave portion CV is formed on the upper surface of the post electrode PE. When a width of the opening 11a formed in the protection film 11 is set to be equal to or larger than twice a width of the opening 10a formed in the surface protection film 10 and the width of the opening 11a is set to be close to the diameter R1 of the stem portion ST of the post electrode PE, the concave portion CV can be formed even if the first plating film 14 with a large thickness which fills the opening 11a is formed.

Note that the post electrode PE may be formed of only the first plating film 14.

The solder ball electrode 16 is formed on the post electrode PE. The solder ball electrode 16 is a lead-free solder material made of, for example, ternary tin (Sn)-silver (Ag)-copper (Cu). Specifically, it is possible to use a solder material having a composition ratio of Sn-1.0Ag-0.5Cu. In addition, the solder material may be changed in composition ratio and may contain bismuth (Bi) or other additives if necessary.

The bump electrode BE formed on the pad electrode PA of the semiconductor chip CHP is constituted of the seed film 12, the post electrode PE and the solder ball electrode 16, and the bump electrode BE is connected to the terminal TA via the pre-solder 17 formed on the front surface of the terminal TA of the wiring board WB. The pre-solder 17 is made of, for example, a lead-free solder material of the ternary tin (Sn)-silver (Ag)-copper (Cu), which is the same material as the solder ball electrode 16. Although FIG. 5 illustrates the shape of the solder ball electrode 16 before being melted, the solder ball electrode 16 and the pre-solder 17 are mixed in practice.

The present embodiment has a characteristic that a size of the solder ball electrode 16 is increased by reducing the height of the post electrode PE and providing the overhanging portion OH in the post electrode PE. In other words, the height (H2) of the solder ball electrode 16 is made larger than the height (H1) of the post electrode PE by using the post electrode PE having the overhanging portion OH. Preferably, the height (H2) of the solder ball electrode 16 is set to be equal to or larger than twice the height (H1) of the post electrode PE. With such a structure, it is possible to reduce the thickness of the resist film used in forming the post electrode PE. Accordingly, it is possible to reduce the material cost and processing time required for the manufacture of the semiconductor device, and thus the reduction of the manufacturing cost can be achieved.

In addition, since the post electrode PE is configured to have the overhanging portion OH, the adhesion of the solder material constituting the solder ball electrode 16 to the side surface (sidewall) of the post electrode PE can be prevented, and thus the improvement in reliability or performance of the semiconductor device can be achieved. In other words, since the solder material does not adhere to the side surface of the post electrode PE, the post electrode PE is in contact with the sealing material UF over the entire side surface in the height direction and the circumferential direction.

Here, the height (H1) of the post electrode PE corresponds to a distance from the upper surface of the protection film 11 to the upper surface of the post electrode PE (upper surface of the stem portion ST except for the concave portion CV) for which the post electrode PE is in contact with the sealing material UF. In addition, the height (H2) of the solder ball electrode 16 corresponds to a distance from the upper surface of the post electrode PE to the upper surface of the terminal TA of the wiring board WB (surface on a side to which the solder ball electrode 16 is connected).

<Manufacturing Method of Semiconductor Device>

The semiconductor device according to the present embodiment is configured as described above, and a manufacturing method thereof will be described below with reference to the drawings.

Figure 6:
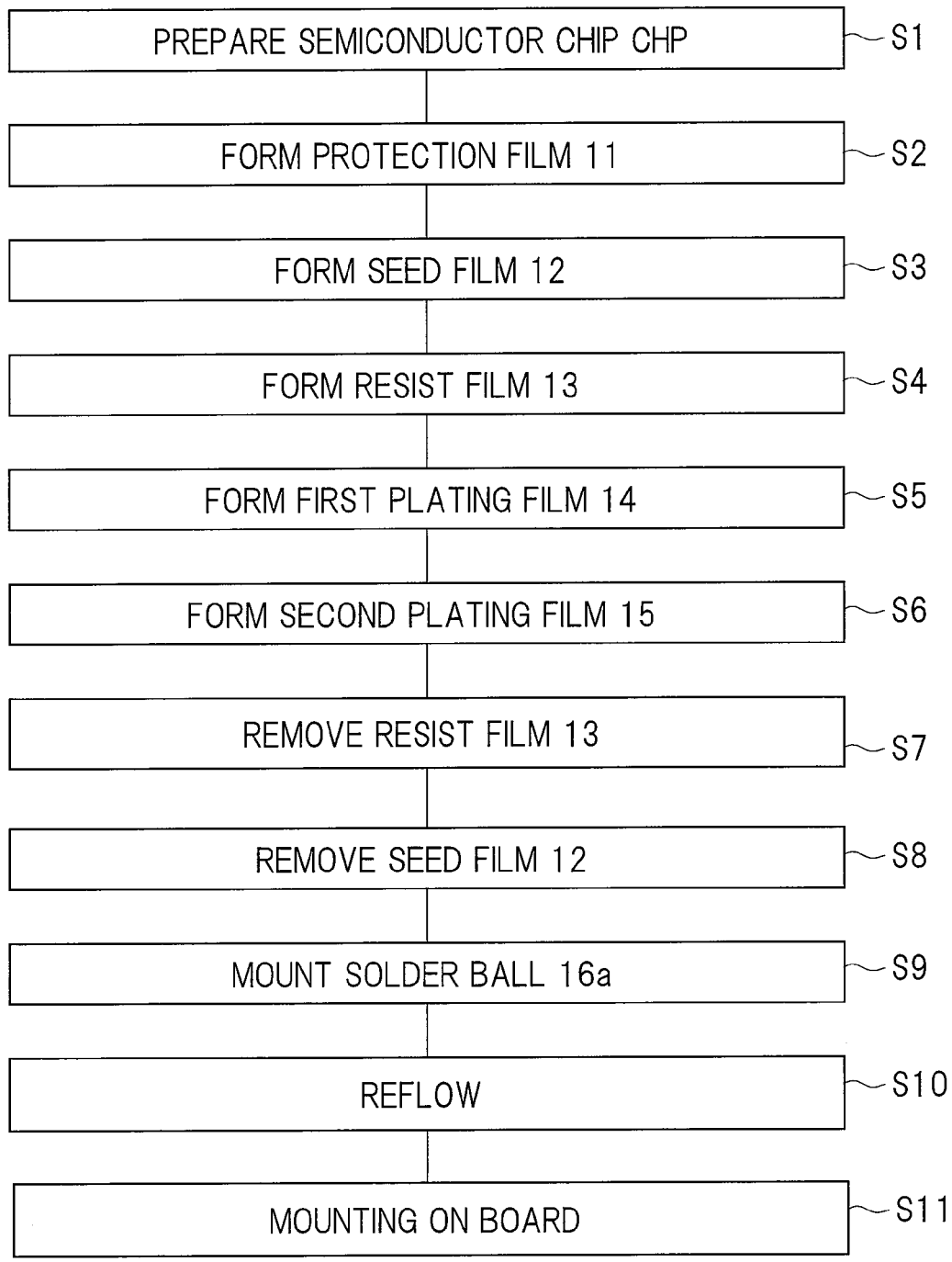
FIG. 6 is a process flow diagram illustrating a part of a manufacturing process of the semiconductor device according to the embodiment.

FIG. 6 is a process flow diagram illustrating a part of the manufacturing process of the semiconductor device according to the embodiment. FIGS. 7 to 12 are cross-sectional views illustrating a main part in the manufacturing process of the semiconductor device according to the present embodiment.

Figure 7:
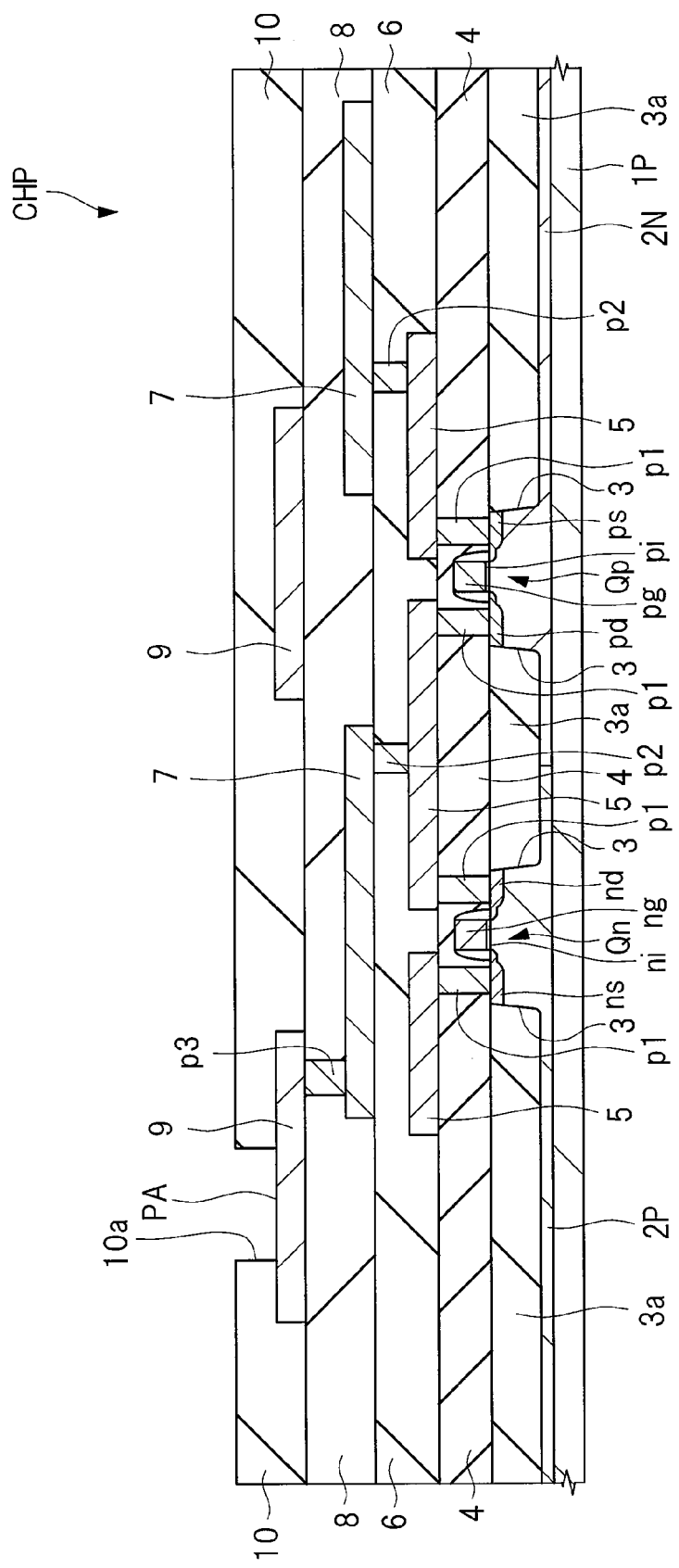
FIG. 7 is a cross-sectional view illustrating a main part in the manufacturing process of the semiconductor device according to the present embodiment.

As illustrated in FIG. 7, the semiconductor chip CHP having the pad electrode PA formed on the front surface thereof is prepared (Step S1 of FIG. 6).

As illustrated in FIG. 7, for example, a p-type well 2P, an n-type well 2N and an element isolation trench 3 are formed in a semiconductor substrate 1P made of p-type monocrystalline silicon, and an element isolation insulating film 3a made of, for example, a silicon oxide film is buried in the element isolation trench 3.

An n-channel MIS transistor (Qn) is formed in the p-type well 2P. The n-channel MIS transistor (Qn) is formed in an active region defined by the element isolation trench 3, and includes a source region ns and a drain region nd which are formed in the p-type well 2P and a gate electrode ng which is formed on the p-type well 2P with a gate insulating film ni interposedtherebetween. In addition, a p-channel MIS transistor (Qp) is formed in the n-type well 2N, and the p-channel MIS transistor (Qp) includes a source region ps and a drain region pd, and a gate electrode pg which is formed on the n-type well 2N with a gate insulating film pi interposed therebetween.

A wiring made of a metal film for connecting semiconductor elements is formed in an upper part of the n-channel MIS transistor (Qn) and the p-channel MIS transistor (Qp). The wiring which connects the semiconductor elements has a multilayer wiring structure including about three to ten layers in general, and FIG. 7 illustrates three wiring layers (first-layer Al wiring 5, second-layer Al wiring 7 and third-layer Al wiring 9) constituted of a metal film having Al alloy as a main component as an example of the multilayer wiring. The wiring layer is used in the case of collectively indicating a plurality of wirings formed in the respective wiring layers. With respect to the film thickness of the wiring layers, the wiring layer of the second layer is thicker than the wiring layer of the first layer, and the wiring layer of the third layer is thicker than the wiring layer of the second layer.

Interlayer insulating films 4, 6 and 8 made of silicon oxide films and plugs p1, p2 and p3 which electrically connect the wirings of the three layers to each other are formed between the n-channel and p-channel MIS transistors (Qn and Qp) and the first-layer Al wiring 5, between the first-layer Al wiring 5 and the second-layer Al wiring 7, and between the second-layer Al wiring 7 and the third-layer Al wiring 9, respectively.

The interlayer insulating film 4 is formed on the semiconductor substrate 1P so as to cover the semiconductor elements, for example, and the first-layer Al wiring 5 is formed on the interlayer insulating film 4. The first-layer Al wiring 5 is electrically connected to the source region ns, the drain region nd and the gate electrode ng of the n-channel MIS transistor (Qn) serving as the semiconductor element via the plug p1 formed in the interlayer insulating film 4, for example. In addition, the first-layer Al wiring 5 is electrically connected to the source region ps, the drain region pd and the gate electrode pg of the p-channel MIS transistor (Qp) serving as the semiconductor element via the plug p1 formed in the interlayer insulating film 4. Illustration of the connection between the gate electrodes ng and pg and the first-layer Al wiring 5 is omitted.

The second-layer Al wiring 7 is electrically connected to the first-layer Al wiring 5 via the plug p2 formed in the interlayer insulating film 6, for example. The third-layer Al wiring 9 is electrically connected to the second-layer Al wiring 7 via the plug p3 formed in the interlayer insulating film 8, for example. The plugs p1, p2 and p3 are constituted of metal films, for example, W (tungsten) films.

Note that, when the multilayer wiring (three-layer wiring) is made of a metal film having Cu as a main component by a chemical mechanical polishing method (CMP method), it is a matter of course that a dual damascene method to form the wiring and the plug in an integrated manner may be employed. In addition, the interlayer insulating films 4, 6 and 8 are made of the silicon oxide film ($SiO_2$), but it is a matter of course that the interlayer insulating films may be constituted of a monolayer film or a laminated film of a silicon oxide film containing carbon (SiOC film), a silicon oxide film containing nitrogen and carbon (SiCON film), and a silicon oxide film containing fluorine (SiOF film).

The surface protection film (protection film or insulating film) 10 which is made of a monolayer film of a silicon oxide film, a silicon nitride film or the like or a two-layer film thereof is formed as a final passivation film on an upper part of the third-layer Al wiring 9 which is the uppermost wiring layer of the multilayer wiring. Further, the third-layer Al wiring 9 which is the uppermost wiring layer exposed to a bottom portion of the pad opening (opening) 10a formed in the surface protection film 10 constitutes the pad electrode (pad or electrode pad) PA. Here, the pad electrode PA may be a metal film such as a copper wiring layer or a metal film having a laminated structure including a copper film and a nickel film on the copper film.

Figure 8:
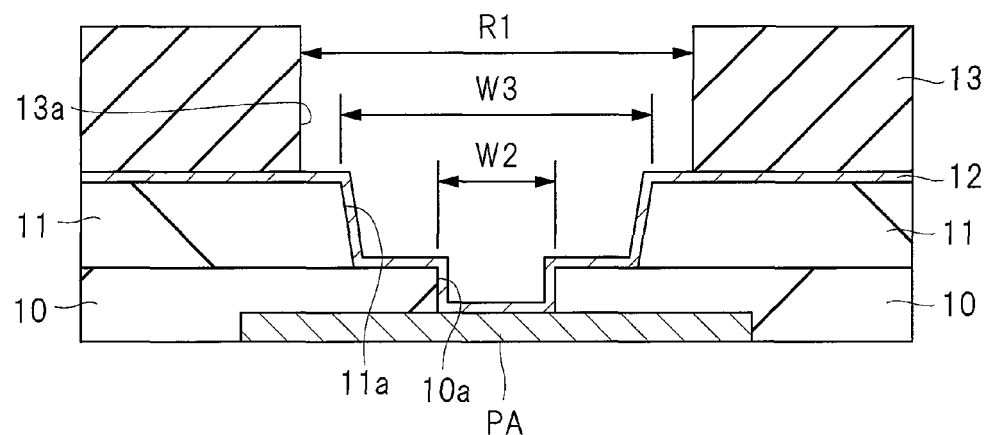
FIG. 8 is a cross-sectional view illustrating a main part in the manufacturing process of the semiconductor device continued from FIG. 7.

Next, the protection film (insulating film) 11 is formed on the surface protection film 10 (Step S2 of FIG. 6) as illustrated in FIG. 8. A photosensitive polyimide resin is used as the protection film 11. After the photosensitive polyimide is applied on the surface protection film 10, exposure and development are performed to expose the opening 10a and the pad electrode PA, and then, the photosensitive polyimide is hardened by performing curing (heat treatment). In other words, the protection film 11 having the opening 11a which is larger than the opening 10a and the pad electrode PA is formed. When seen in a plan view, the openings 10a and 11a have a square shape. It is preferable that a width W3 of the opening 11a is equal to or larger than twice a width W2 of the opening 10a and comes close to the diameter R1 of the stem portion ST of the post electrode PE described above.

Next, the seed film 12 is formed on the protection film 11 (Step S3 of FIG. 6). The seed film 12 has a laminated structure including a barrier film and a plating seed film on the barrier film. The barrier film is made of, for example, a titanium nitride film (TiN film) formed by the sputtering method or the chemical vapor deposition (CVD) method, and a film thickness thereof is 50 nm. The plating seed film is made of, for example, a copper (Cu) film formed by the sputtering method, and a film thickness thereof is 200 nm. The seed film 12 is in contact with an upper surface of the pad electrode PA, and is formed on the sidewall of the surface protection film 10 and the sidewall of the protection film 11 constituting the openings 10a and 11a and on the upper surface of the surface protection film 10 and the upper surface of the protection film 11.

Next, a resist film (insulating film or organic insulating film) 13 is formed on the seed film 12 (Step S4 of FIG. 6). It is possible to use a liquid resist or a dry film resist as the resist film 13, and a film thickness thereof is, for example, 12 μm. The resist film 13 has an opening 13a, and the opening 13a encloses the openings 11a and 10a and exposes the pad electrode PA. When seen in a plan view, the opening 13a has a circular shape, and a diameter thereof corresponds to the diameter R1 of the stem portion ST of the post electrode PE described with reference to FIG. 5, and the diameter R1 of the opening 13a is larger than the widths W3 and W2 of the openings 11a and 10a.

Figure 9:
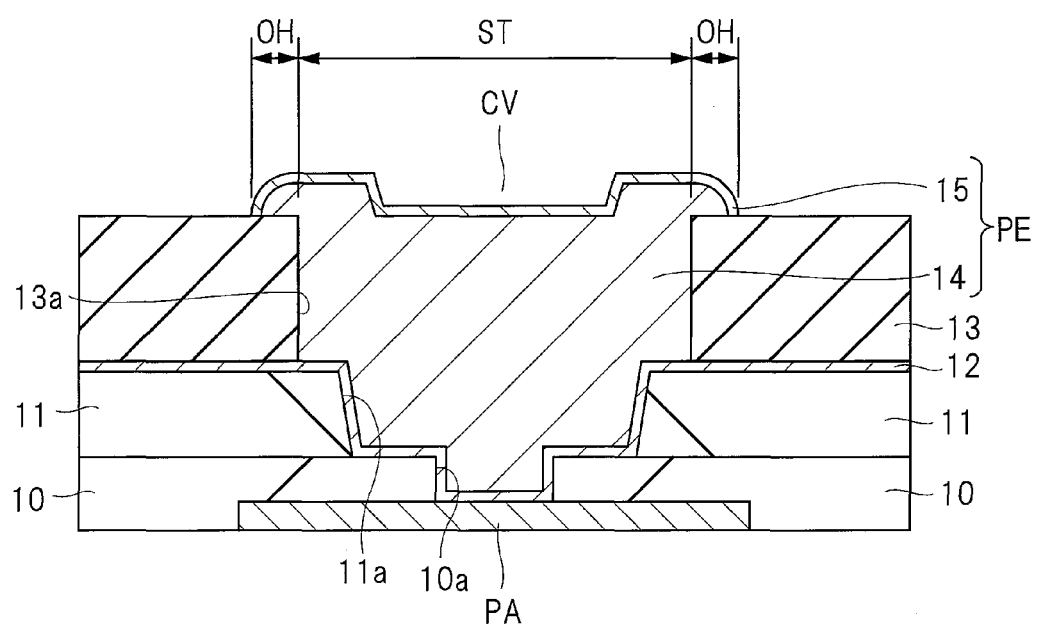
FIG. 9 is a cross-sectional view illustrating a main part in the manufacturing process of the semiconductor device continued from FIG. 8.

Next, the first plating film 14 is formed in the opening 13a of the resist film 13, and then, the second plating film 15 is formed on the first plating film 14 (Steps S5 and S6 of FIG. 6) as illustrated in FIG. 9. The first plating film 14 and the second plating film are formed by the electrolytic plating method. In this electrolytic plating process, the seed film 12 functions as a seed layer. The first plating film 14 is a copper (Cu) plating film and the second plating film 15 is a nickel (Ni) plating film. The first plating film 14 is formed to have such a film thickness that completely fills the openings 10a and 11a and fills most of the opening 13a. Further, it is preferable that the first plating film 14 overhangs from the opening 13a of the resist film 13 to an upper surface of the resist film 13 on an outer side of the opening 13a. Also, since the second plating film 15 is formed on the front surface of the first plating film 14 exposed from the resist film 13, it is continuously formed on the first plating film 14 positioned from the opening 13a of the resist film 13 to the upper surface of the resist film 13.

Since the overhanging portion OH described with reference to FIG. 5 is constituted of the first plating film 14 and the second plating film 15 in the present embodiment, the protruding width W1 of the overhanging portion OH overhanging on the resist film 13 can be set to be about 3 μm when the first plating film 14 formed on the seed film 12 on the protection film 11 is formed to have a film thickness of about 14 μm and the second plating film 15 is formed to have a film thickness of about 1 μm. In addition, when the second plating film 15 is not formed, the protruding width W1 of the overhanging portion OH can be set to be about 3 μm by setting the film thickness of the first plating film 14 to be 15 μm.

The post electrode PE constituted of the first plating film 14 and the second plating film 15 is formed through the above-described processes of forming the first plating film 14 and the second plating film 15. Depending on presence or absence of the protection film 11, the concave portion CV is formed on the opening 11a of the protection film 11 in the center portion of the upper surface of the post electrode PE. When seen in a plan view, the concave portion CV has an approximately rectangular shape, and the concave portion CV is positioned inside the square opening 11a. In addition, the concave portion CV is formed in the center portion of the post electrode PE when seen in a plan view. The concave portion CV is formed on the upper surfaces of the first plating film 14 and the second plating film 15.

Figure 10:
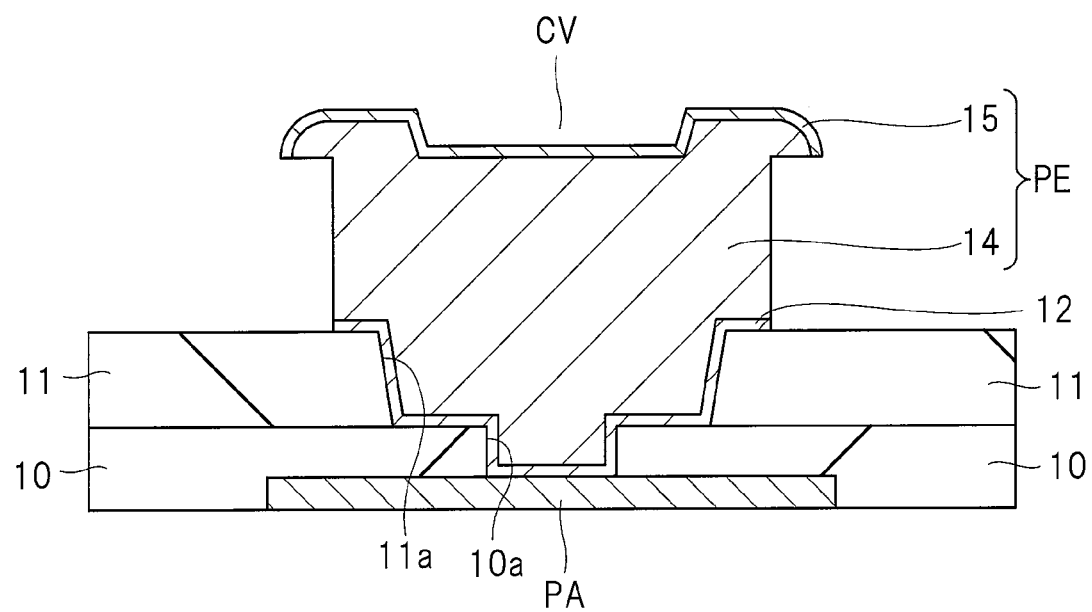
FIG. 10 is a cross-sectional view illustrating a main part in the manufacturing process of the semiconductor device continued from FIG. 9.

Next, the resist film 13 is removed (Step S7 of FIG. 6), and thereafter, the seed film 12 is removed (Step S8 of FIG. 6) as illustrated in FIG. 10. First, the resist film 13 which has been used as a mask in forming the first plating film 14 and the second plating film 15 is completely removed from the top of the seed film 12. Next, the exposed seed film 12 is subjected to, for example, a wet etching, thereby removing the seed film 12 in a region exposed from the first plating film 14. The seed film 12 in a region covered with the first plating film 14 is left without being etched, and thus, the seed film 12 is interposed between the first plating film 14 and each of the pad electrode PA, the surface protection film 10 and the protection film 11.

Figure 11:
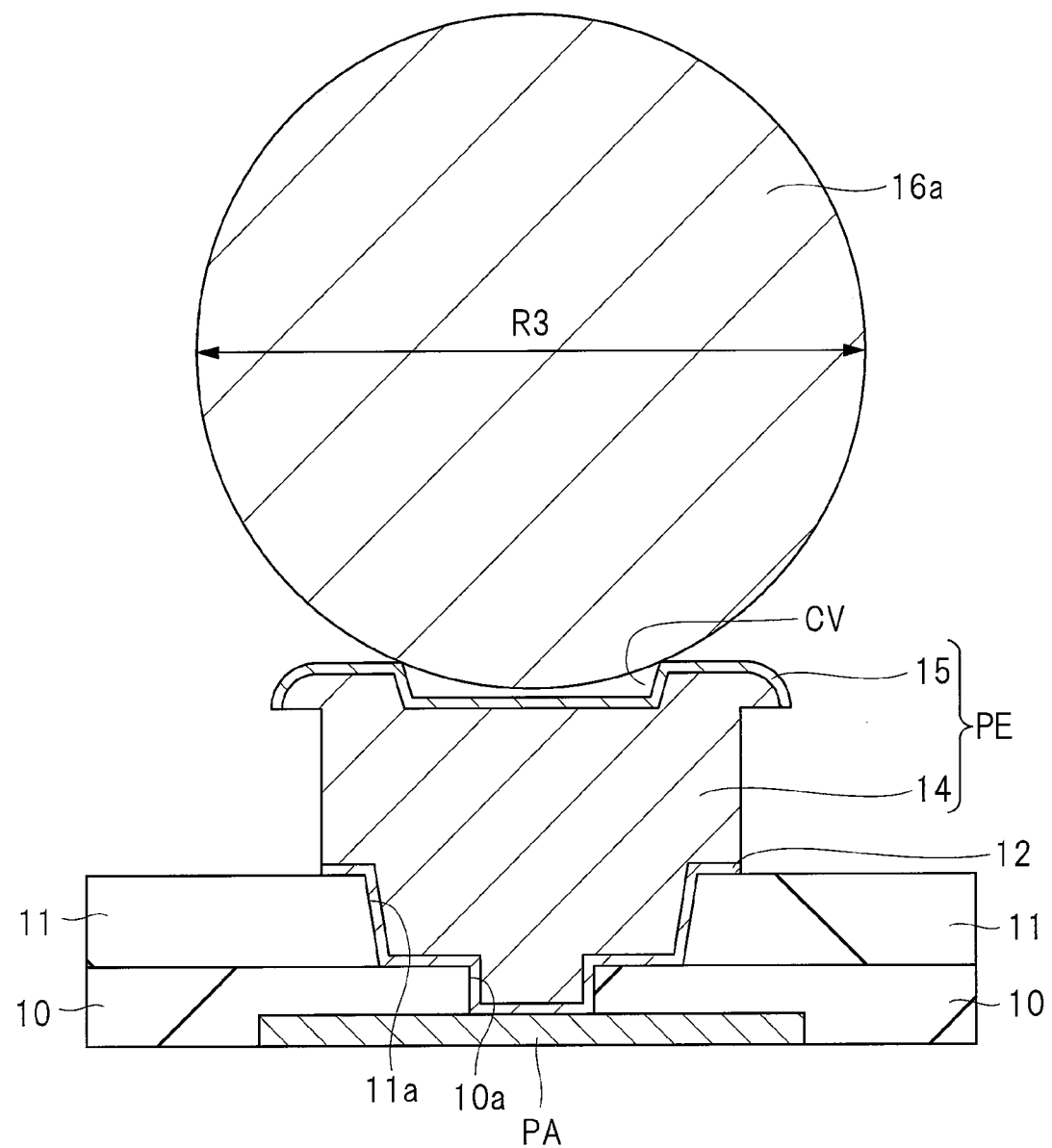
FIG. 11 is a cross-sectional view illustrating a main part in the manufacturing process of the semiconductor device continued from FIG. 10.

Next, a solder ball 16a is mounted onto the post electrode PE as illustrated in FIG. 11 (Step S9 of FIG. 6). First, a flux is formed (applied) on the upper surface of the post electrode PE, and the oxide film or the like formed on the front surface of the post electrode PE is removed. Next, the solder ball 16a is mounted onto the post electrode PE. The solder ball 16a is a ternary solder material containing, for example, Sn-1.0Ag-0.5Cu and has a spherical shape, and a diameter R3 thereof is, for example, about 85 μm. In the present embodiment, it is preferable to use the solder ball 16a having the diameter R3 of 60 μm or more. Since the concave portion CV is formed in the center portion of the upper surface of the post electrode PE, the solder ball 16a is mounted onto the post electrode PE so that a part of the solder ball 16a having the spherical shape is fit into the concave portion CV.

Figure 12:
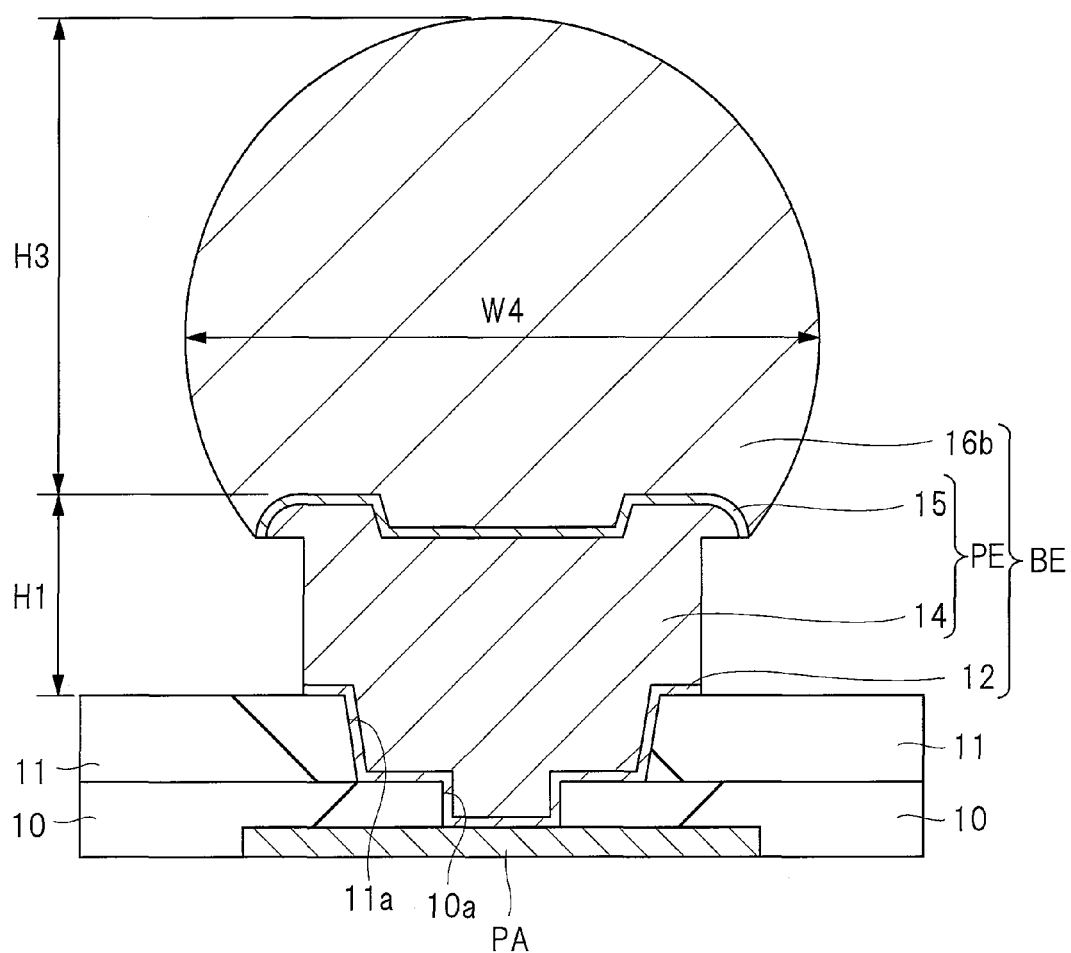
FIG. 12 is a cross-sectional view illustrating a main part in the manufacturing process of the semiconductor device continued from FIG. 11.

Next, the reflow (heat treatment) is performed to the solder ball 16a as illustrated in FIG. 12 (Step S10 of FIG. 6). The reflow is performed at a temperature equal to or higher than a melting point of the solder material constituting the solder ball 16a, for example, 240° C. to 300° C., and a solder ball electrode 16b is formed by melting the solder ball 16a to wet and spread on the upper surface of the post electrode PE. At this time, since the post electrode PE has the overhanging portion OH, it is possible to reduce or prevent the solder material (for example, tin (Sn)) constituting the solder ball 16a from flowing and dropping down on the sidewall of the post electrode PE in the reflow process.

Since a volume of the solder ball electrode 16b after the reflow and a volume of the solder ball 16a before the reflow are equal, a largest width W4 of the solder ball electrode 16b in the lateral direction is slightly larger than the diameter R3 of the solder ball 16a, but it is possible to say that the width W4 is substantially equal to the diameter R3 of the solder ball 16a (W4≈R3). Since the solder ball 16a having the spherical shape wets and spreads on the upper surface of the post electrode PE, a height H3 from the upper surface of the post electrode PE to a tip end of the solder ball electrode 16b is smaller than the diameter R3 of the solder ball 16a. In addition, the height (H3) of the solder ball electrode 16b after the reflow is substantially equal to the height (H2) of the solder ball electrode 16 after being mounted which has been described with reference to FIG. 5 (H3≈H2).

The bump electrode BE on the pad electrode PA is completed through the processes described above. The bump electrode BE is constituted of the seed film 12, the post electrode PE and the solder ball electrode 16b. In addition, the overhanging portion OH of the post electrode PE is constituted of the laminated film of the first plating film 14 and the second plating film 15.

Figure 13:
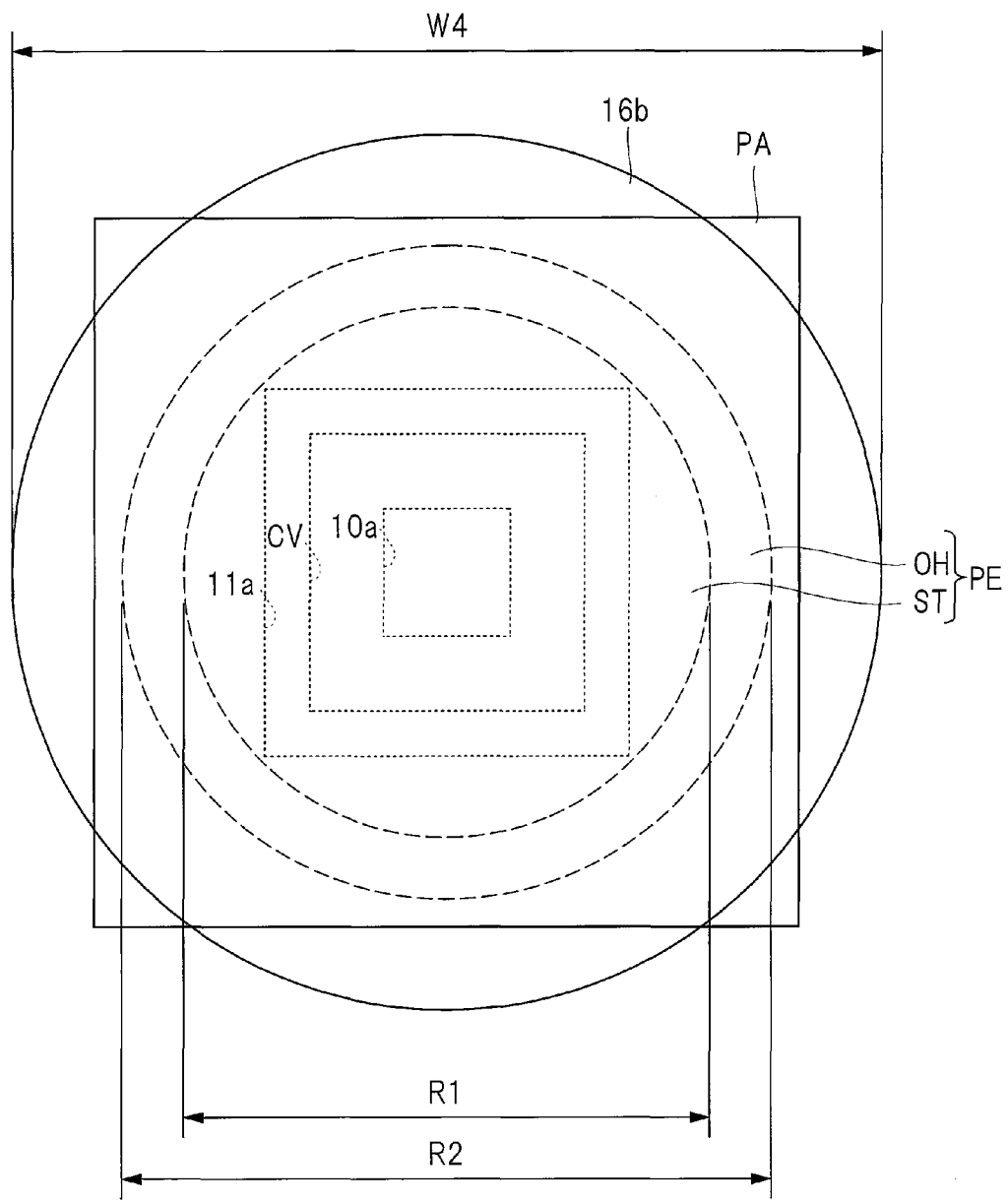
FIG. 13 is a plan view of FIG. 12.

FIG. 13 is a plan view of FIG. 12. The post electrode PE is electrically connected to the pad electrode PA via the opening 11a of the protection film 11 and the opening 10a of the surface protection film 10. When seen in a plan view, the post electrode PE includes the stem portion ST having the circular shape and the overhanging portion OH overhanging around the stem portion ST and the contour of the overhanging portion OH also has the circular shape. The diameter R2 of a circle that represents the contour of the overhanging portion OH is larger than the diameter R1 of a circle that represents a contour of the stem portion ST. In addition, a contour of the solder ball electrode 16b also has a circular shape, and the diameter W4 thereof is larger than the diameter R2 of the circle that represents the contour of the overhanging portion OH.

Next, the mounting on the board is performed (Step S11 of FIG. 6), thereby completing the semiconductor device. The semiconductor chip CHP including the bump electrode BE is mounted on the terminal TA of the wiring board WB. At this time, the pre-solder 17 is formed on the front surface of the terminal TA by a method such as a printing method. Next, the heat treatment is applied to the wiring board WB on which the semiconductor chip CHP has been mounted so as to bond the solder ball electrode 16b and the pre-solder 17, thereby completing the semiconductor device. The lead-free solder material made of ternary tin (Sn)-silver (Ag)-copper (Cu) can be used also as the pre-solder 17.

Note that the inventors of the present application have defined a ratio of the height (H3) of the solder ball electrode 16b after the reflow to the diameter (R3) of the solder ball 16a as a bump ratio BR. According to the study by the inventors of the present application, the above-described "solder adhesion failure" occurs when the bump ratio BR is 40% or higher in the case of using the post electrode having the cylindrical shape. Further, it has been confirmed that the "solder adhesion failure" does not occur when the bump ratio BR is 75% or lower in the case of using the post electrode PE including the overhanging portion OH described in the embodiment above.

First Modified Example

Figure 14:
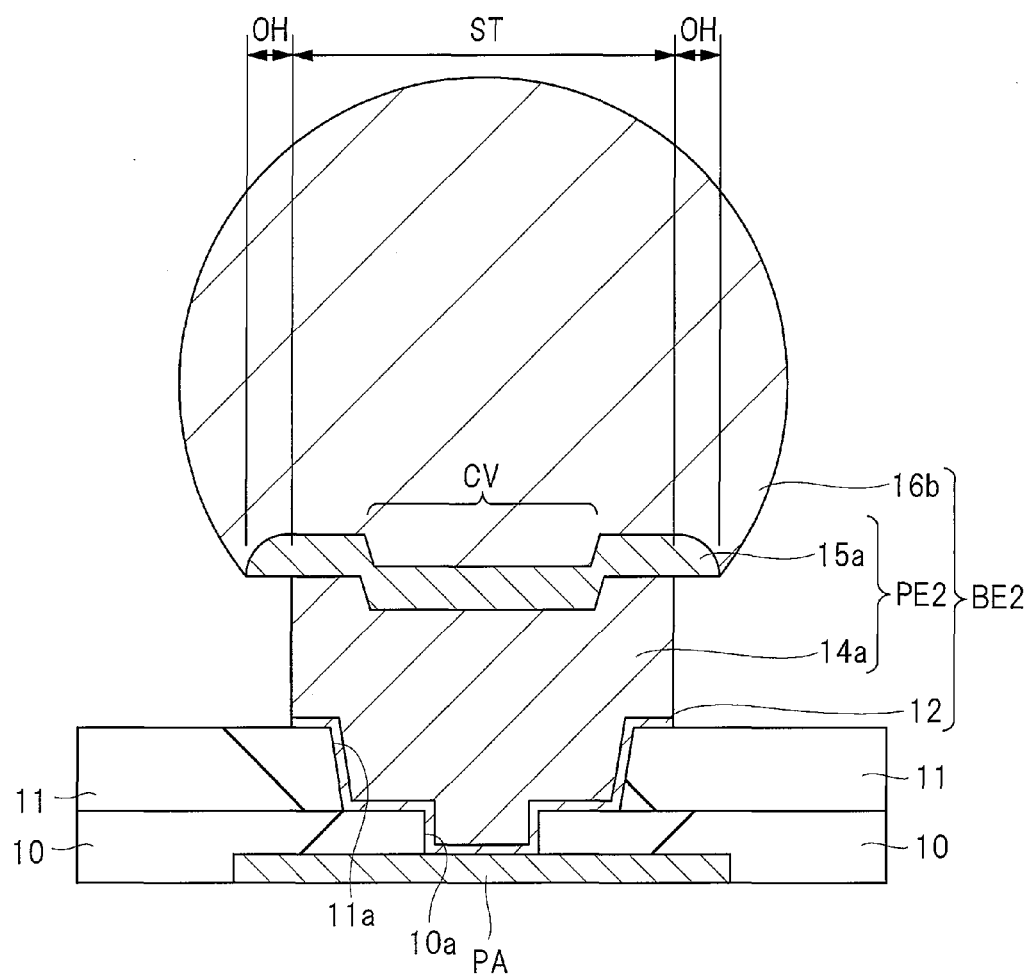
FIG. 14 is a cross-sectional view illustrating a main part of a first modified example of a bump electrode of FIG. 12.
Figure 15:
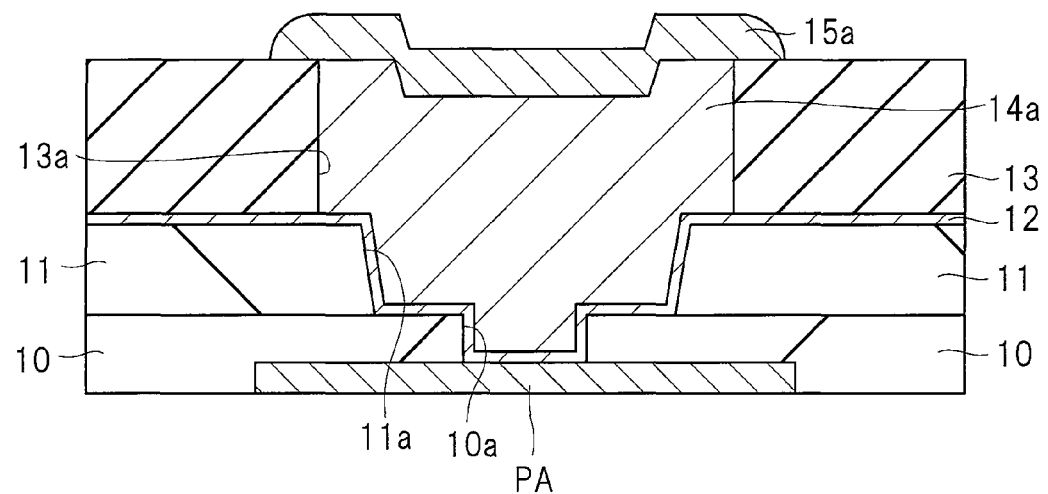
FIG. 15 is a cross-sectional view illustrating a main part in a manufacturing process of a semiconductor device of the first modified example.

Next, a modified example of the above-described embodiment will be described. FIG. 14 is a cross-sectional view illustrating a main part of a first modified example of the bump electrode of FIG. 12. FIG. 15 is a cross-sectional view illustrating a main part in a manufacturing process of a semiconductor device of the first modified example.

In the above-described embodiment, the overhanging portion OH of the post electrode PE is constituted of the laminated film of the first plating film 14 and the second plating film 15, but the overhanging portion OH is constituted of only a second plating film 15a in the first modified example as illustrated in FIG. 14. In other words, the stem portion ST of a post electrode PE2 has a laminated structure including a first plating film 14a and the second plating film 15a, but the overhanging portion OH is constituted of a monolayer film of the second plating film 15a, and the first plating film 14a does not constitute the overhanging portion OH.

Further, a bump electrode BE2 is constituted of the seed film 12, the post electrode PE2 and the solder ball electrode 16b.

The semiconductor device of the first modified example can be formed through the process illustrated in the process flow diagram of FIG. 6, and thus, only a different part will be described hereinafter. Namely, the process of forming the first plating film 14 (Step S5) and the process of forming the second plating film 15 (Step S6) in FIG. 6 are different from the above-described embodiment.

As illustrated in FIG. 15, the first plating film 14a is formed in the opening 13a after forming the resist film 13 having the opening 13a, but the first plating film 14a does not overhang above the resist film 13. In other words, a height of an upper surface of the first plating film 14a is equal to the height of the upper surface of the resist film 13 or smaller than the height of the upper surface of the resist film 13.

Next, the second plating film 15a is formed on the first plating film 14a. The second plating film 15a is formed to overhang from the opening 13a of the resist film 13 to the upper surface of the resist film 13. For example, when the first plating film 14a is formed to have a film thickness of 12 µm which is equal to the film thickness of the resist film 13, and then, the second plating film 15a is formed to have a film thickness of 3 µm, the overhanging portion OH made of the second plating film 15a can be formed to have the protruding width W1 of about 3 µm.

Next, the process of removing the resist film 13 (Step S7) and the process subsequent thereto illustrated in FIG. 6 are performed to complete the semiconductor device of the first modified example.

If it is assumed that the protruding width W1 of the overhanging portion OH is equal between the first embodiment and the first modified example, the protruding width W1 of the overhanging portion OH and the film thickness of the second plating film 15a become equal in the first modified example, and accordingly, it is possible to increase the film thickness of the second plating film 15a. The second plating film 15a made of a nickel (Ni) film or a nickel (Ni) alloy film has the spreading barrier function to prevent tin (Sn) contained in the solder ball electrode 16b from spreading in the copper (Cu) film constituting the first plating film 14a of the post electrode PE2. In other words, it is possible to further improve the spreading barrier function by increasing the film thickness of the second plating film 15a, and the heat resistance of the semiconductor device (bump electrode BE2) can be improved.

Second Modified Example

Figure 16:
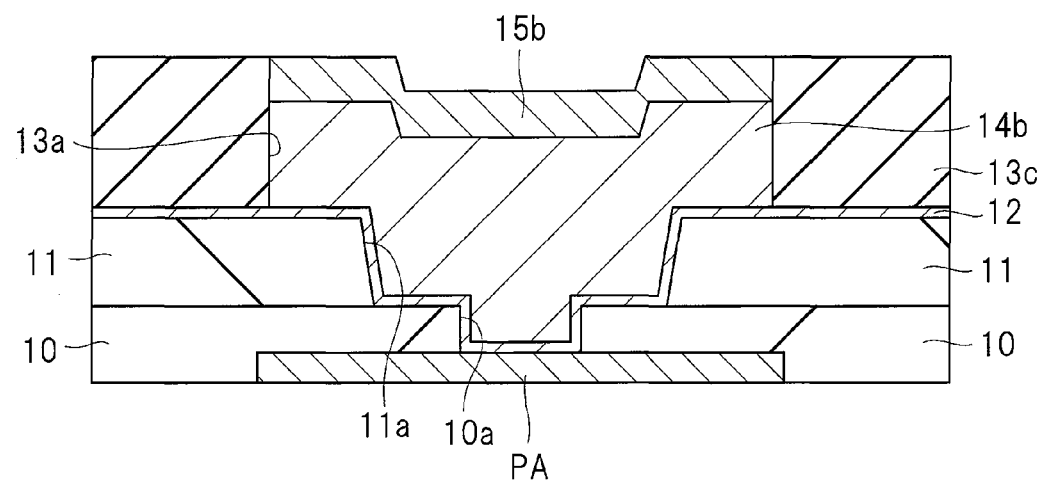
FIG. 16 is a cross-sectional view illustrating a main part in a manufacturing process of a semiconductor device of a second modified example.
Figure 17:
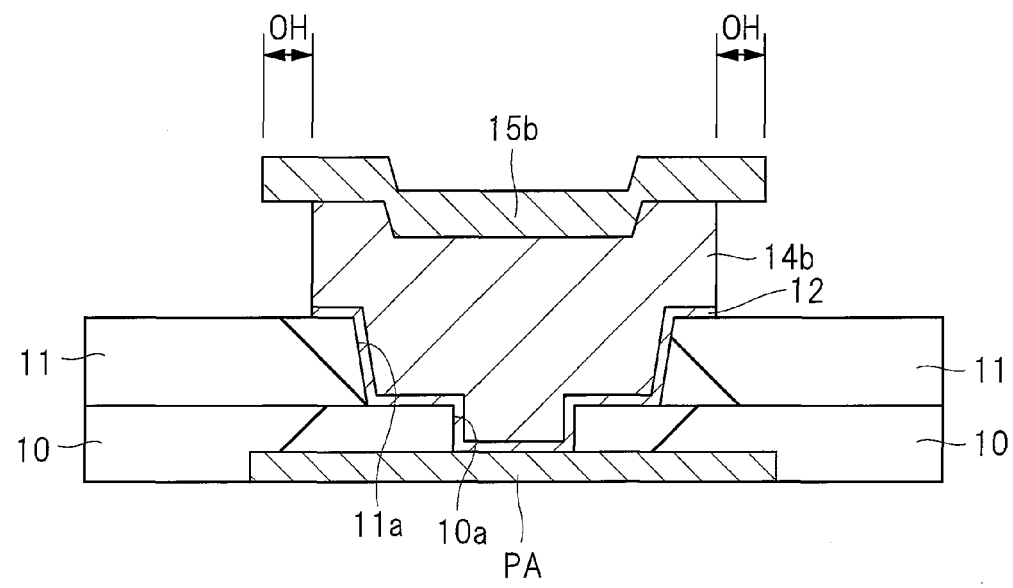
FIG. 17 is a cross-sectional view illustrating a main part in the manufacturing process of the semiconductor device continued from FIG. 16.

Next, another modified example of the above-described embodiment will be described. FIGS. 16 and 17 are cross-sectional views illustrating a main part in a manufacturing process of a semiconductor device of a second modified example.

The semiconductor device of the second modified example can be formed through the process illustrated in the process flow diagram of FIG. 6, and thus, only a different part will be described hereinafter.

As illustrated in FIG. 16, a resist film 13c having an opening 13b with the diameter R2 corresponding to the contour of the overhanging portion OH is formed in a process of forming the resist film 13c (Step S4).

Next, a process of forming a first plating film 14b (Step S5) and a process of forming a second plating film 15b (Step S6) are performed so that an upper surface of the second plating film 15b formed on the first plating film 14b is equal to or lower than a height of an upper surface of the resist film 13c. In other words, the first plating film 14b and the second plating film 15b do not overhang to the upper surface of the resist film 13c.

Next, after a process of removing the resist film 13c (Step S7), a sidewall of the first plating film 14b is etched and retracted, thereby forming the overhanging portion OH constituted of the second plating film 15b. For example, in a case in which the first plating film 14b is a copper film and the second plating film 15b is a nickel film, ammonia hydrogen peroxide and sulfuric acid/hydrogen peroxide are used as etchant. First, a passivation film is formed on a front surface of the second plating film 15b by the ammonia hydrogen peroxide, and then, wet etching using the sulfuric acid/hydrogen peroxide is performed, thereby selectively retracting the first plating film 14b. The protruding width W1 of the overhanging portion OH of the second plating film 15b is preferably 2 µm to 10 µm.

Next, the process of removing the seed film 12 (Step S8) and the process subsequent thereto illustrated in FIG. 6 are performed to complete the semiconductor device of the second modified example.

The second modified example has a characteristic that it is possible to set the protruding width W1 of the overhanging portion OH without depending on the film thickness of the plating film constituting the overhanging portion OH.

In the foregoing, the invention made by the inventors of the present invention has been concretely described based on the embodiments. However, it is needless to say that the present invention is not limited to the foregoing embodiments and various modifications and alterations can be made within the scope of the present invention.

In addition, some of the contents described in the above-described embodiment will be described hereinafter.

[Appendix 1]

A manufacturing method of a semiconductor device includes:

(a) a step of preparing a semiconductor substrate having a pad electrode formed on a main surface thereof;

(b) a step of forming a first insulating film having a first opening to expose a part of the pad electrode, on the main surface of the semiconductor substrate;
(c) a step of depositing a first metal film on the pad electrode and the first insulating film;
(d) a step of forming a second insulating film having a second opening to expose a part of the first metal film, on the first metal film;
(e) a step of forming a first plating film on the first metal film in the second opening;
(f) a step of forming a second plating film on the first plating film;
(g) a step of removing the second insulating film;
(h) a step of performing etching to the first plating film, thereby forming an overhanging portion in the second plating film;
(i) a step of disposing a solder ball on the second plating film; and
(j) a step of melting the solder ball and forming a solder ball electrode wetting and spreading on an entire upper surface of the second plating film, and
the upper surface of the second plating film is equal to an upper surface of the second insulating film or lower than the upper surface of the second insulating film.

[Appendix 2]

In the manufacturing method of the semiconductor device according to Appendix 1, the first plating film is made of a copper film, and the second plating film is made of a nickel film.

[Appendix 3]

In the manufacturing method of the semiconductor device according to Appendix 2, the etching is performed so that each front surface of the first plating film and the second plating film is processed by ammonia hydrogen peroxide, and then, the first plating film is selectively etched by sulfuric acid/hydrogen peroxide.

What is claimed is:

1. A semiconductor device comprising:
    a semiconductor substrate;
    a pad electrode which is formed on the semiconductor substrate;
    a post electrode which is electrically connected to the pad electrode and is made of a copper film formed on the pad electrode;
    a solder ball electrode which is formed on the post electrode and is made of a ternary alloy containing tin;
    a terminal which is connected to the solder ball electrode and is formed on a front surface of a wiring board; and
    a sealing material which fills a gap between the semiconductor substrate and the wiring board,
    wherein the post electrode includes a stem portion having a cylindrical shape and an overhanging portion which protrudes to an outer side of the stem portion in an upper part of the stem portion,
    the solder ball electrode is connected to an upper surface of the post electrode over the stem portion and the overhanging portion, and
    a sidewall of the stem portion of the post electrode is in contact with an underfill over an entire circumference thereof.

2. The semiconductor device according to claim 1, wherein a protruding width of the overhanging portion from the sidewall of the stem portion is 2 µm or larger and 10 µm or smaller.

3. The semiconductor device according to claim 1, wherein a nickel film is interposed between the post electrode and the solder ball electrode in the stem portion and the overhanging portion.

4. The semiconductor device according to claim 1, further comprising:
    a first insulating film which covers the pad electrode and has a first opening to expose an upper surface of the pad electrode,
    wherein the post electrode fills the first opening and extends to an upper surface of the first insulating film, and
    the underfill is in contact with the first insulating film.

5. The semiconductor device according to claim 4, further comprising:
    a second insulating film which covers an upper surface of the wiring board and has a second opening to expose the terminal,
    wherein a height from the upper surface of the post electrode to an upper surface of the terminal exposed from the second opening is larger than a height from the upper surface of the first insulating film to the upper surface of the post electrode.

6. The semiconductor device according to claim 5, wherein the height from the upper surface of the post electrode to the upper surface of the terminal exposed from the second opening is equal to or larger than twice the height from the upper surface of the first insulating film to the upper surface of the post electrode.

7. A manufacturing method of a semiconductor device comprising:
    (a) a step of preparing a semiconductor substrate having a pad electrode on a main surface thereof;
    (b) a step of forming a first insulating film having a first opening to expose a part of the pad electrode, on the main surface of the semiconductor substrate;
    (c) a step of depositing a first metal film on the pad electrode and the first insulating film;
    (d) a step of forming a second insulating film having a second opening to expose a part of the first metal film, on the first metal film;
    (e) a step of forming a first plating film on the first metal film, and forming a post electrode which includes a stem portion positioned in the second opening and an overhanging portion positioned on the second insulating film around the second opening;
    (f) a step of removing the second insulating film;
    (g) a step of disposing a solder ball on the post electrode; and
    (h) a step of melting the solder ball and forming a solder ball electrode wetting and spreading on upper surfaces of the stem portion and the overhanging portion.

8. The manufacturing method of a semiconductor device according to claim 7,
    wherein the stem portion has a sidewall, the solder ball electrode is formed only on the upper surfaces of the stem portion and the overhanging portion, and the sidewall of the stem portion is exposed from the solder ball electrode.

9. The manufacturing method of a semiconductor device according to claim 8,
    wherein a protruding width of the overhanging portion from the sidewall is 2 µm or larger and 10 µm or smaller.

10. The manufacturing method of a semiconductor device according to claim 7, wherein the solder ball is made of a solder material containing tin, gold and copper.

11. The manufacturing method of a semiconductor device according to claim 7, further comprising:
a step of forming a second plating film on a front surface of the first plating film,
wherein the first plating film is made of a copper film, and the second plating film is made of a nickel film.

12. A manufacturing method of a semiconductor device comprising:
(a) a step of preparing a semiconductor substrate having a pad electrode on a main surface thereof;
(b) a step of forming a first insulating film having a first opening to expose a part of the pad electrode, on the main surface of the semiconductor substrate;
(c) a step of depositing a first metal film on the pad electrode and the first insulating film;
(d) a step of forming a second insulating film having a second opening to expose a part of the first metal film, on the first metal film;
(e) a step of forming a first plating film on the first metal film in the second opening;
(f) a step of forming a second plating film on the first plating film;
(g) a step of removing the second insulating film;
(h) a step of disposing a solder ball on the second plating film; and
(i) a step of melting the solder ball and forming a solder ball electrode wetting and spreading on an entire upper surface of the second plating film,
wherein an upper surface of the first plating film is lower than an upper surface of the second insulating film,
the second plating film is formed on the upper surface of the first plating film and the second insulating film around the second opening, and
the second plating film includes an overhanging portion to an outer side of the first plating film.

13. The manufacturing method of a semiconductor device according to claim 12,
wherein the first plating film has a sidewall, and
a protruding amount of the overhanging portion from the sidewall is 2 μm or larger and 10 μm or smaller.

14. The manufacturing method of a semiconductor device according to claim 12, the method further comprising:
a step of forming a third plating film on a front surface of the second plating film.

15. The manufacturing method of a semiconductor device according to claim 14,
wherein the first plating film is made of a copper film, the second plating film is made of a nickel film, and the third plating film is made of a gold film.

* * * * *